United States Patent [19]
Campbell et al.

[11] Patent Number: 6,061,154
[45] Date of Patent: *May 9, 2000

[54] SYSTEM AND METHOD FOR STEERING FOCAL PLANE DATA TO ACCESS DATA LOCATIONS IN A HOLOGRAPHIC MEMORY

[75] Inventors: Scott Patrick Campbell, Chatham; Kevin Richard Curtis, Summit; Michael C. Tackitt, Califon, all of N.J.

[73] Assignee: Lucent Technologies, Inc., Murray Hill, N.J.

[ * ] Notice: This patent is subject to a terminal disclaimer.

[21] Appl. No.: 08/881,540

[22] Filed: Jun. 24, 1997

[51] Int. Cl.[7] .............................. G03H 1/22; G11C 13/04; G11B 7/00

[52] U.S. Cl. .............................. 359/32; 359/22; 359/30; 359/33; 369/103; 365/125; 365/216

[58] Field of Search .................................. 359/22, 28, 30, 359/32, 33, 10, 11, 17, 18, 29; 365/125, 216; 369/102, 103, 205, 225

[56] References Cited

U.S. PATENT DOCUMENTS

| | | | |
|---|---|---|---|
| 4,155,630 | 5/1979 | Ih | 359/10 |
| 5,436,867 | 7/1995 | Mok | 365/216 |
| 5,659,536 | 8/1997 | Maillot et al. | 369/103 |
| 5,822,263 | 10/1998 | Campbell et al. | 365/216 |
| 5,835,470 | 11/1998 | Campbell et al. | 369/103 |

Primary Examiner—Cassandra Spyrou
Assistant Examiner—Jennifer Winstedt

[57] ABSTRACT

Systems and methods for steering a complex, spatially-modulated incident beam of coherent light to gain access to data locations in a holographic memory cell (HMC). One of the systems includes: (1) a reflective element, locatable proximate a first focal plane of the incident beam, (2) a rotational steering mechanism, coupled to the reflective element, that orients the reflective element according to a desired rotational angle to steer the incident beam in a desired direction and (3) a refractive element that refracts the beam reflected from the reflective element to create a second focal plane for the beam, the HMC locatable proximate the second focal plane to receive the beam at a location thereon that is a function of the desired direction.

18 Claims, 7 Drawing Sheets

SYSTEM AND METHOD FOR STEERING FOCAL PLANE DATA TO ACCESS DATA LOCATIONS IN A HOLOGRAPHIC MEMORY

TECHNICAL FIELD OF THE INVENTION

The present invention is directed, in general, to holographic memory devices and, more specifically, to an optical system for accessing data locations in a holographic memory.

CROSS-REFERENCE TO RELATED APPLICATIONS

The present invention is related to that disclosed in:
1. U.S. Pat. application Ser. No. U.S. Pat. No. 5,844,701, entitled "System and Method Using Linear Translation to Access Data Locations in a Holographic Memory" and filed concurrently herewith;
2. U.S. Pat. application Ser. No. U.S. Pat. No. 5,859,808, entitled "System and Method for Steering Fresnel Region Data to Access Data Locations in a Holographic Memory" and filed concurrently herewith;
3. U.S. Pat. application Ser. No. U.S. Pat. No. 5,822,263, entitled "System and Method for Precessing an Optical Path Using Cylindrical Coordinates to Access Data Locations in a Holographic Memory" and filed concurrently herewith;
4. U.S. Pat. application Ser. No. U.S. Pat. No. 5,835,470, entitled "System and Method for Steering Focal Plane Data Using Cylindrical Coordinates to Access Data Locations in a Holographic Memory" and filed concurrently herewith; and
5. U.S. Pat. application Ser. No. U.S. Ser. No. 08/881,404, entitled "System and Method for Steering Fresnel Region Data Using Cylindrical Coordinates to Access Data Locations in a Holographic Memory" and filed concurrently herewith.

Each reference is commonly assigned with the present invention.

BACKGROUND OF THE INVENTION

Most modern processing systems, including personal computers (PCs), rely on one form or another of optical data storage. For example, CD-ROM drives are now standard equipment on nearly all new PCs. Nearly all multimedia software, including video games, maps, encyclopedias, and the like, are sold on CD-ROM. Also, compact discs are the most prevalent storage medium for musical recording. More recently, digital video disc (DVD) technology has been introduced that will expand the storage capacity of standard CD technology from about one-half gigabyte to about five gigabytes.

The large storage capacities and relatively low costs of CD-ROMs and DVDs have created an even greater demand for still larger and cheaper optical storage media. Many large businesses rely on jukebox-style CD changers in order to access a particular one of potentially hundreds of discs. Motion pictures released in optical storage format still require multiple CDS, DVDs, or oversized laser discs. However, it appears that the limits of CD-ROM and DVD technology are being reached. In order to continue to improve the capacity and speed of optical storage systems, research increasingly focuses on holographic storage devices capable of storing hundreds of gigabytes in a CD-sized storage medium.

A number of holographic data storage systems have been developed that are capable of storing and retrieving an entire page of data at a time. In these systems, data to be stored is first encoded in a two dimensional (2D) optical array, for example on a liquid crystal display (LCD) screen, which is one type of spatial light modulator (SLM). Another type of SLM is Texas Instruments' Digital Mirror Device, which is a reflective device that allows the reflectivity of each pixel to be changed. The term "SLM" also includes fixed masks of varying optical density, phase, or reflectivity.

A first laser beam, a plane wave, is transmitted through the SLM and picks up an intensity and/or phase pattern from the data squares or rectangles (pixels) in the 2D array. This data-encoded beam, called an object beam, is ultimately projected onto and into a light-sensitive material, called a holographic memory cell (HMC). A second laser beam, called a reference beam, is also projected onto and into the HMC. The object beam and the reference beam then cross at the HMC to produce an interference pattern throughout a volume element of the HMC. This unique interference pattern induces material alterations in the HMC that generate a hologram.

The formation of the hologram in the HMC is a function of the relative amplitudes and polarization states of, and the phase differences between, the object beam and the reference beam. It is also highly dependent on the incident angles at which the object beam and the reference beam are projected onto the HMC. After hologram storage, the data beam may be reconstructed by projecting into the HMC a reference beam that is the same as the reference beam that produced the hologram. The hologram and the reference beam then interact to reproduce the data-encoded object beam, which may then be projected onto a two-dimensional array of light sensitive detectors which read back the data by sensing the pattern of light and dark pixels.

The object beam produced by the spatial light modulator has a high space-bandwidth product (SBP). The SBP of a beam is equal to the number of resolvable pixels the beam contains. For example, the 800×600 pixel image produced by a SVGA computer monitor has a SBP of 480,000. When high SBP beams are projected into an HMC, it is important to keep the optical path lengths traversed by the beams constant. Otherwise, the high SBP image will go out of focus and the data will be lost.

Maintaining a constant optical path length in order to keep the high SBP image of the object beam in focus necessarily makes it difficult to steer the object beam to different areas on the surface of the HMC, because such steering frequently causes the optical path length to change. However, many holographic memory systems incorporate reference beams whose SBP=1. Because of the small reference beam SBP, such a holographic data storage system can project its reference beam through an acousto-optic cell, which diffracts the reference beam through an optical system, such as a 4-f imaging system, that has a fixed optical path length. Altering the frequency of the acoustic wave changes the angle at which the reference beam is diffracted and therefore incident to the surface of the HMC. Systems utilizing such angle-tuned reference beam steering are known as "angle multiplexing" systems and are distinguished by their ability to project different pages of data into the same location on the surface of the HMC by using different angles of reference-beam incidence. The data is then retrieved by steering the interrogating reference beam at different angles of incidence. However, these prior art systems are inadequate to steer a high SBP beam, such as a typical object beam, to different areas of the HMC because of their inherent limitations with respect to high space-bandwidth product throughput.

Accordingly, there is a need in the art for improved optical systems that are capable of steering high space-bandwidth product beams to different regions on the surface of an HMC without causing the beam to lose focus. There is a further need in the art for improved optical systems capable of steering high space-bandwidth product images in more than one dimension in a coordinate system. There is a still further need in the art for improved optical systems capable of steering complex reference beams in more than one dimension in a coordinate system.

SUMMARY OF THE INVENTION

To address the above-discussed deficiencies of the prior art, the present invention provides systems and methods for steering a complex, spatially-modulated incident beam of coherent light to gain access to data locations in an HMC. One of the systems includes: (1) a reflective element, locatable proximate a first focal plane of the incident beam, (2) a rotational steering mechanism, coupled to the reflective element, that orients the reflective element according to a desired rotational angle to steer the incident beam in a desired direction and (3) a refractive element that refracts the beam reflected from the reflective element to create a second focal plane for the beam, the HMC locatable proximate the second focal plane to receive the beam at a location thereon that is a function of the desired direction.

The present invention therefore introduces the broad concept of rotating a reflective element, such as a mirror, to read or write to different locations on an HMC.

In one embodiment of the present invention, the first focal plane is a Fourier plane. Alternatively, the first focal plane may be an image plane.

In one embodiment of the present invention, the second focal plane is an image plane. Alternatively, the second focal plane may be a Fourier plane.

In one embodiment of the present invention, the reflective element is a mirror.

In one embodiment of the present invention, the refractive element is a convex lens. Alternatively, the refractive element may be a concave lens, provided that other elements are included to focus the beam.

In one embodiment of the present invention, the HMC is substantially planar. However, the present invention is employable with nonplanar HMCs, should they be advantageous in a given application.

In one embodiment of the present invention, the system further comprises a spatial light modulator for receiving coherent light from a light source and emitting a coherent data-encoded light beam therefrom, wherein the data-encoded light beam has a space-bandwidth product greater than 100. In such an embodiment, the incident beam of light is derived from the data-encoded light beam.

In one embodiment of the present invention, the system further comprises: (1) a second reflective element, locatable proximate the second focal plane, (2) a second rotational steering mechanism, coupled to the second reflective element, that orients the second reflective element according to a second desired rotational angle to steer the incident beam in a second desired direction and (3) a second refractive element that refracts the beam reflected from the second reflective element to create a third focal plane for the beam, the HMC locatable proximate the third focal plane to receive the beam at a planar location thereon that is further a function of the second desired direction.

While some embodiments of the present invention provide for one-dimensional traversals of the HMC, the above-described embodiment provides for two-dimensional traversal. If the (first) refractive element and the second refractive element are rotated about axes normal to one another, the resulting beam can be made to traverse a cartesian plane, allowing the location on the HMC to be located on a plane (planar).

The foregoing has outlined, rather broadly, various embodiments of the present invention so that those skilled in the art may better understand the detailed description of the invention that follows. More specific embodiments of the invention will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
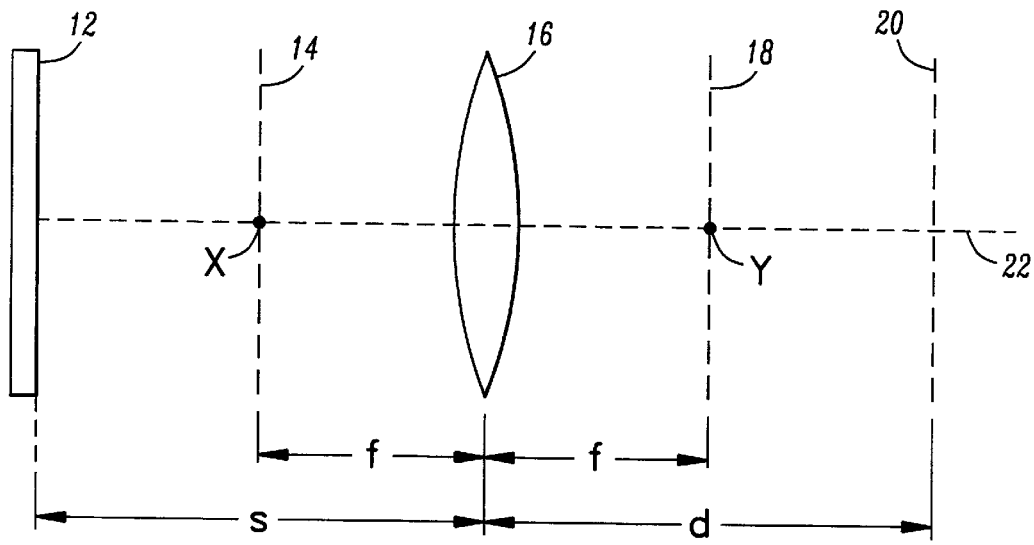
FIG. 1A illustrates a conventional single lens system.

FIG. 1A illustrates a conventional single lens imaging system 10. Although single lens systems are well known, single lens system 10 is described here in detail so that the descriptions of the present invention which follow may be more clearly understood. Single lens system 10 comprises spatial light modulator (SLM) 12 and thin convex lens 16. Lens 16 has two focal points. Focal point X lies in plane 14, shown as a dotted line, one focal length, f, away from lens 16. On the opposite side of lens 16, focal point Y lies in plane 18, shown as a dotted line, one focal length, f, away from lens 16. SLM 12 comprises, for example, a liquid crystal display (LCD) screen on which data is encoded in a two-dimensional (2D) pattern of transparent and opaque pixels. SLM 302 may comprise a phase mask or a mask with mixed phase and amplitude modulation. SLM 12 and lens 16 are positioned orthogonally to optical path 22, shown as a dotted line. If a thin lens having a focal length, f, is positioned at a distance, s, from an input object, the lens will form an output image at a distance, d, on the opposite side of the lens, according to the thin lens equation: $1/f=(1/s+1/d)$. In the configuration shown in FIG. 1A, SLM 12 is positioned at a distance, s, from lens 16, so that the output image of SLM 12 is formed at plane 20, shown as a dotted line, at a distance, d, away from lens 16. In selected embodiments of the present invention described below, s, d, and f are selected so that s=d=2f, and the total separation, s+d, between SLM 12 and its output image is therefore 4-f.

Figure 1B:
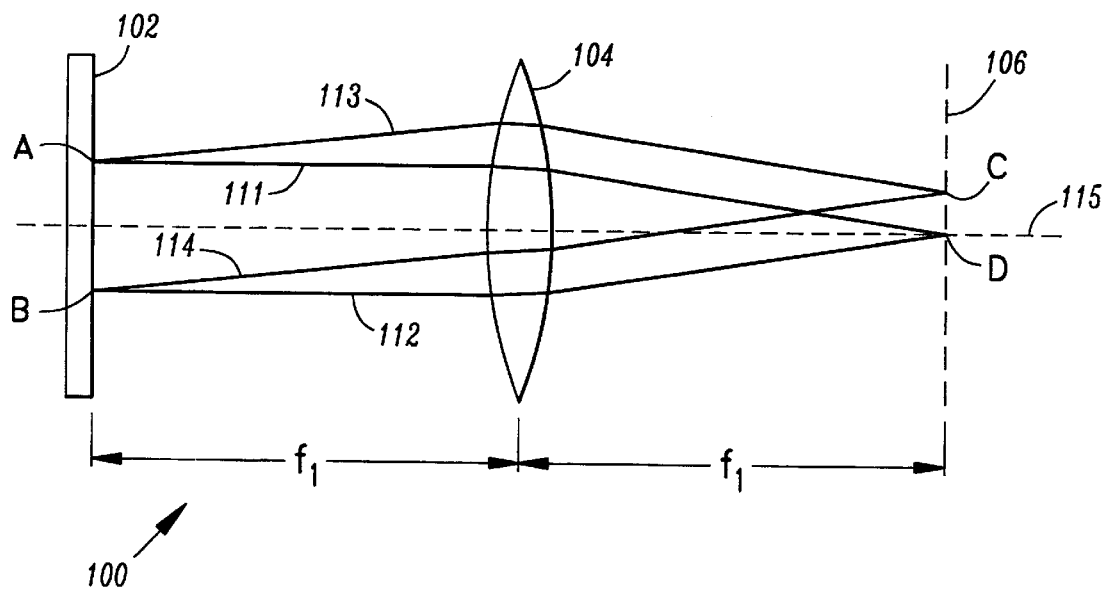
FIG. 1B illustrates a conventional single lens Fourier transforming system.

FIG. 1B illustrates a conventional single lens Fourier transforming system 100. Although Fourier transforms of input objects are well known, Fourier transform system 100 is described here in detail so that the descriptions of the present invention which follow may be more clearly understood. An object beam of coherent laser light is projected through SLM 102 and picks up the encoded data pattern and propagates distance $f_1$ to reach lens 104. The object beam passes through lens 104 and propagates distance f, again to reach Fourier plane 106. At the Fourier plane, all of the object beam's positional information becomes angular information and all of the object beam's angular information becomes positional information.

This phenomenon may be understood by reference to light beams 111 and 113, which emanate from point A on SLM 102, and to light beams 112 and 114, which emanate from point B on SLM 102. The small pixels in the 2D-array pattern on SLM 102 form small apertures that cause diffraction of the object beam as it passes through SLM 102. Thus, light emanates outward from points A and B over a broad range of directions. Light beams 111 and 112 are parallel to one another and propagate perpendicularly outward from SLM 102. Light beams 113 and 114 are also parallel to one another but propagate outward at an oblique angle from SLM 102. Since light beams 111 and 112 are parallel, their angles of incidence at lens 104 are the same. Similarly, since light beams 113 and 114 are parallel, their angles of incidence at lens 104 are the same.

As is well known, it is a property of a thin lens, such as lens 104, that parallel light beams that pass through the lens are focused (converged) by the lens to the same point at the Fourier plane. Thus, parallel beams 111 and 112 converge at point D in Fourier plane 106, even though beams 111 and 112 emanate from different points at SLM 102. Similarly, parallel beams 113 and 114 converge at point C in Fourier plane 106, even though beams 113 and 114 emanate from different points at SLM 102.

It is also a property of a thin lens, such as lens 104, that light beams emanating at different angles (i.e., nonparallel) from the same point at the input object (SLM 102) become parallel light beams after passing through the thin lens. Thus, light beams 111 and 113, which emanate at different angles (i.e., nonparallel) from point A at SLM 102, become parallel to each other after passing through lens 104 and therefore have the same angles of incidence at points C and D in Fourier plane 106. Likewise, light beams 112 and 114, which emanate at different angles (i.e., nonparallel) from point B at SLM 102, become parallel to each other after passing through lens 104 and therefore have the same angles of incidence at points C and D in Fourier plane 106.

From the foregoing, it can be seen that the position at which a beam of light is incident on Fourier plane 106 is determined by the angle (not the position) at which it left SLM 102. Similarly, it can be seen that the angle at which a beam of light is incident on Fourier plane 106 is determined by the position (not the angle) at which it left SLM 102. Therefore, as was stated above, at the Fourier plane, all of the object beam's positional information becomes angular information and all of the object beam's angular information becomes positional information.

Figure 2:
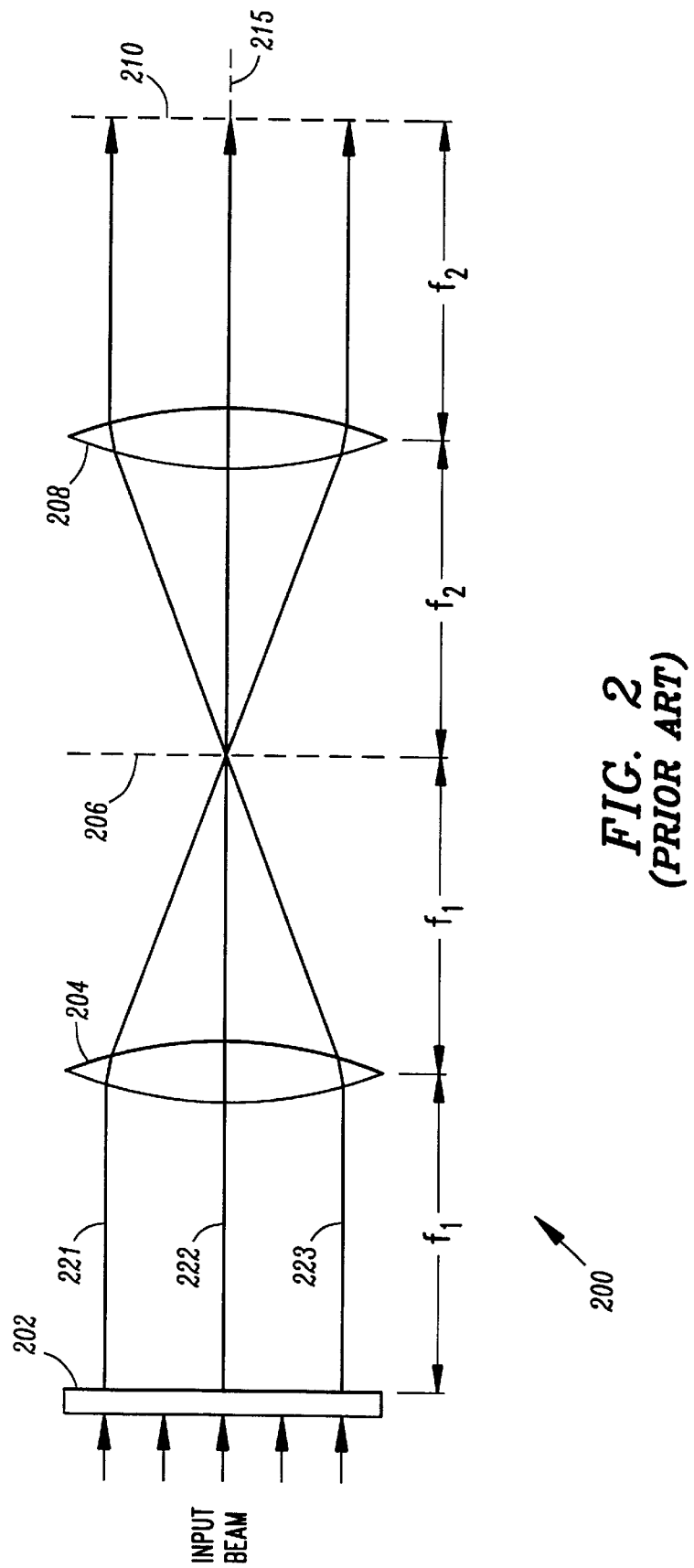
FIG. 2 illustrates a conventional 4-f (four-f) imaging system.

FIG. 2 illustrates a conventional 4-f (four f) imaging system 200. The configuration of 4-f imaging system 200 shown in FIG. 2 is referred to as "infinite conjugate." Although 4-f imaging systems are well known, 4-f imaging system 200 is described here in detail so that the descriptions of the present invention which follow may be more clearly understood. 4-f imaging system 200 comprises spatial light modulator (SLM) 202, thin convex lens 204, which has a focal length, $f_1$, and thin convex lens 208, which has a focal length, $f_2$, where $f_1$ and $f_2$ may or may not be equal. SLM 202 comprises, for example, a liquid crystal display (LCD) screen on which data is encoded in a 2D-array pattern of transparent and opaque pixels. SLM 202 may comprise a phase mask or a mask with mixed phase and amplitude modulation. In one embodiment of the present invention, the data-encoded light beam produced by SLM 202 has a space-bandwidth product greater than 100. SLM 202, lens 204 and lens 208 are positioned orthogonally to optical path 215, shown as a dotted line coincident with solid line 222.

A plane wave object beam of coherent laser light is projected through SLM 202, picks up the encoded data pattern, and propagates distance $f_1$ to reach lens 204. The object beam, represented by light beams 221–223, passes through lens 204 and propagates distance $f_1$ again to reach Fourier plane 206. As explained above with respect to FIG. 1B, at Fourier plane 206, all of the object beam's positional information becomes angular information and all of the object beam's angular information becomes positional information.

The image formed at Fourier plane 206 is the input object for lens 208. From Fourier plane 206, the object beam propagates distance $f_2$ to reach lens 208. After passing through lens 208, the object beam finally propagates distance $f_2$ to reach output image plane 210, where the input data image at SLM 202 is reconstructed. Output image plane 210 is the Fourier plane for plane 206, as well as the output image plane for the plane in which SLM 202 lies. Thus, the image formed at output image plane 210 by lens 208 is the Fourier image of the Fourier image formed at Fourier plane 206 by lens 204.

As light beams 221–223 show, the input data image formed at output image plane 210 is inverted with respect to its appearance at SLM 202. Therefore, if an HMC was positioned at output image plane 210, the inverted image of the 2D-array pattern at SLM 202 would be stored as a page of data in the HMC. A separate reference beam of laser light (not shown) would be required in order to store the data image.

In alternate embodiments of the above-described optical systems, the spatial light modulator may be positioned between the initial lens and the following Fourier plane. An object beam that is incident to the initial lens will be converged by the initial lens, but will pick up the encoded data from the SLM after, rather than before, the initial lens. In such a configuration, the size (positions) of the Fourier orders vary linearly with the distance between the SLM and the following Fourier plane. Additionally, the incident angles of the beams will vary according to the position of the SLM.

Figure 3:
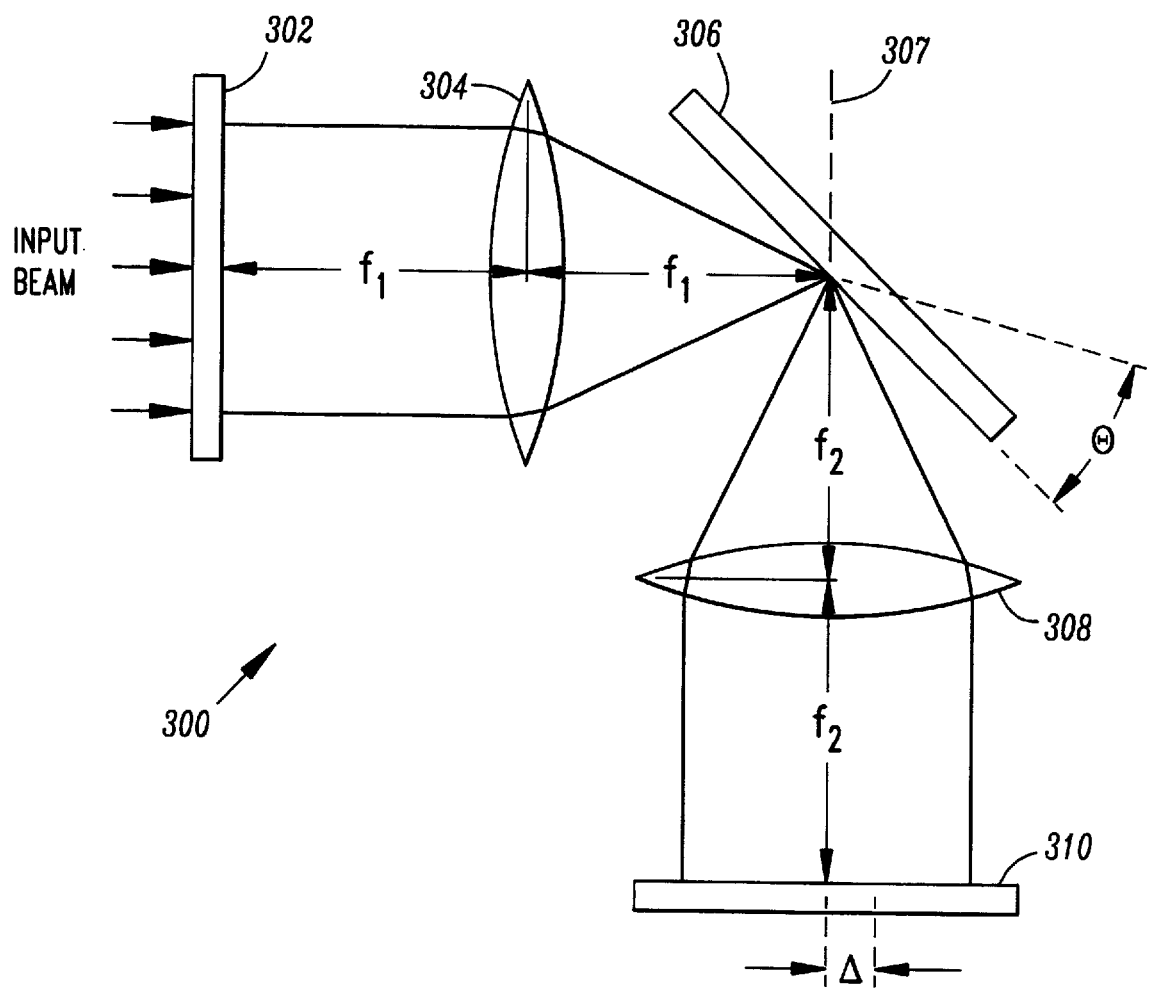
FIG. 3 illustrates a Fourier focal plane steering system according to a first embodiment of the present invention.

FIG. 3 illustrates Fourier focal plane steering system 300 according to a first embodiment of the present invention. Fourier focal plane steering system 300 comprises spatial light modulator (SLM) 302, lens 304, rotatable mirror 306, lens 308 and holographic memory cell (HMC) 310. Lens 304 has a focal length $f_1$ and forms the Fourier transform of the input object on SLM 302 at Fourier focal plane 307 at distance $f_1$ away from lens 304. As in the previous figures, the input object on SLM 302 may be, for example, a 2D-array pattern representing a page of data. SLM 302 may comprise a phase mask or a mask with mixed phase and amplitude modulation. In one embodiment of the present invention, the data-encoded encoded light beam produced by SLM 302 has a space-bandwidth product greater than 100.

As FIG. 3 indicates, rotatable mirror 306 is positioned at Fourier focal plane 307 of the input object on SLM 302. Mirror 306 rotates through an angle, θ, and the beams reflecting off mirror 306 are then subsequently imaged through lens 308 onto HMC 310. The Fourier object at Fourier focal plane 307 is reflected by mirror 306 and forms the input object of lens 308, which has a focal length, $f_2$, and forms its own Fourier transform at distance $f_2$ away from lens 308 on the surface of HMC 310.

In theory, Fourier focal plane steering system 300 is similar to a 4-f imaging system, except that rotatable mirror 306 is positioned at the Fourier focal plane of the first lens in order to steer the object beam. Thus, the output image formed on HMC 310 is an inversion of the input object transmitted from SLM 302. The configuration shown in FIG. 3 is an inventive version of an infinite conjugate arrangement.

The amount of transverse displacement of the image on HMC 310 caused by rotation of mirror 306 is Δ, where Δ=f(tan θ). Regardless of the angle to which mirror 306 rotates, the image at HMC 310 will remain nearly in focus while a moderate range of Δ is scanned. This is true because the optical path lengths for all beams are equal, even though the physical path length of a beam passing through the center of the lens at a zero degree mirror rotation is shorter than the physical path length of a beam passing through the edges of the lens at a non-zero degree mirror rotation.

Figure 4:
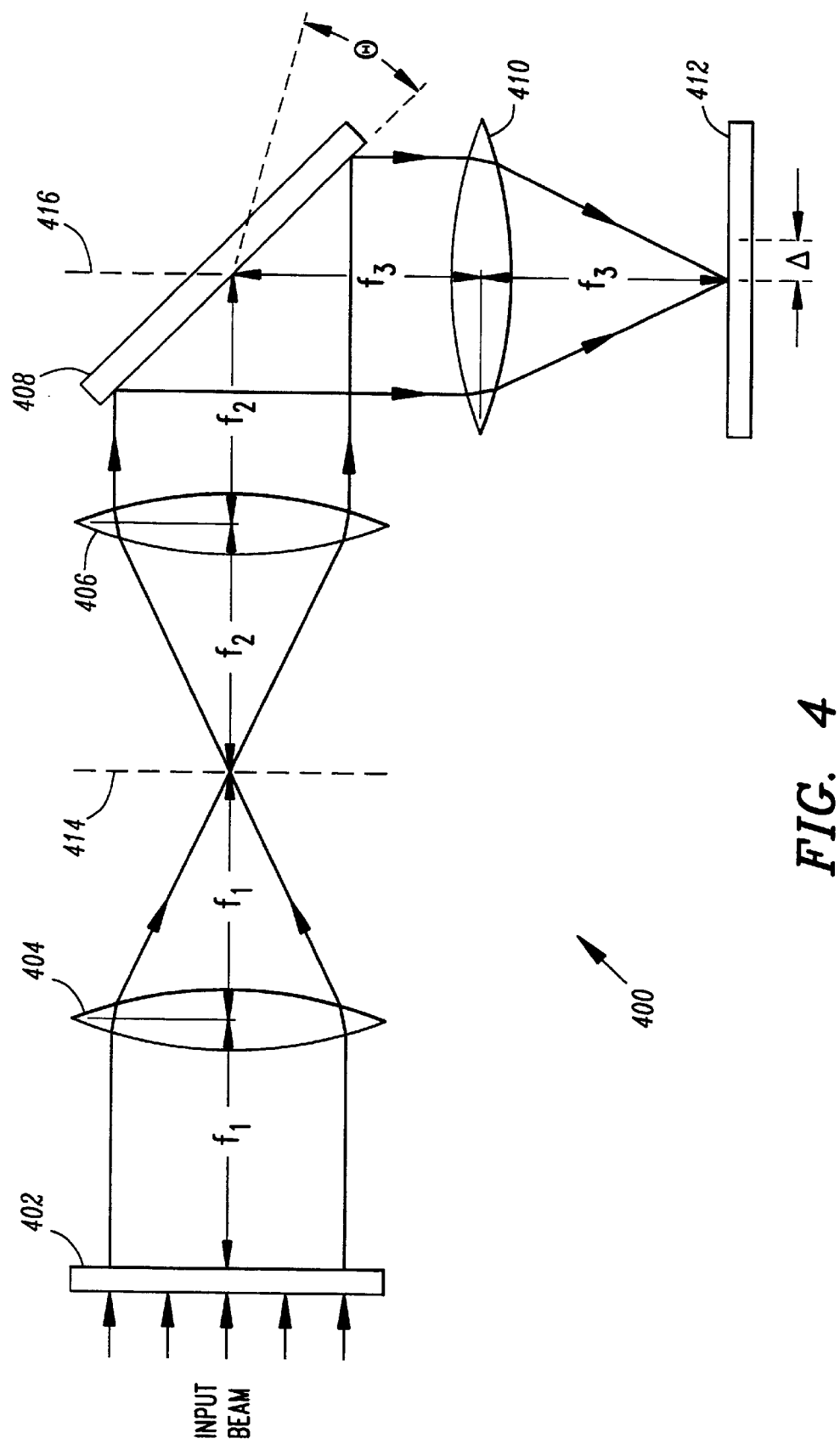
FIG. 4 illustrates an image focal plane steering system according to a second embodiment of the present invention.

FIG. 4 illustrates image focal plane steering system 400 according to a second embodiment of the present invention. Image focal plane steering system 400 comprises spatial light modulator (SLM) 402, lens 404, lens 406, rotatable mirror 408, lens 410 and holographic memory cell (HMC) 412. Lens 404 has a focal length, $f_1$, and forms the Fourier transform of the input object on SLM 302 at Fourier focal plane 414 at distance $f_1$ away from lens 404. As in the previous figures, the input object on SLM 402 may be, for example, a 2D-array pattern representing a page of data.

The Fourier transform formed at Fourier focal plane 414 is the input object for lens 406, which has a focal length, $f_2$. In the configuration shown in FIG. 4, $f=f_1=f_2$, so that the total separation between lenses 404 and 406 is 2f and SLM 402, lens 404 and lens 406 form a 4-f imaging system. Rotatable mirror 408 is positioned at the output image focal plane 416 of the 4-f imaging system formed by SLM 402, lens 404 and lens 406. Thus, an inverted SLM image is imaged onto rotatable mirror 408. Mirror 408 rotates through an angle, θ, and the beams reflecting off mirror 408 are then subsequently Fourier transformed through lens 410 onto HMC 412. The reflection from mirror 408 passes through lens 410, which has a focal length, $f_3$, which in one embodiment is equal to focal lengths $f_1$ and $f_2$. Lens 410 forms at HMC 412 the Fourier transform of the inverted SLM image reflected by mirror 408. In this manner, the Fourier transform of the SLM image is steered around HMC 412, rather than the SLM image itself.

As in the case of Fourier focal plane steering system 300, the amount of transverse displacement of the image on HMC 412 caused by rotation of mirror 408 is Δ, where Δ=f(tan θ). Regardless of the angle to which mirror 408 rotates, the image at HMC 412 will remain nearly in focus while moderate ranges of Δ are scanned.

Figure 5:
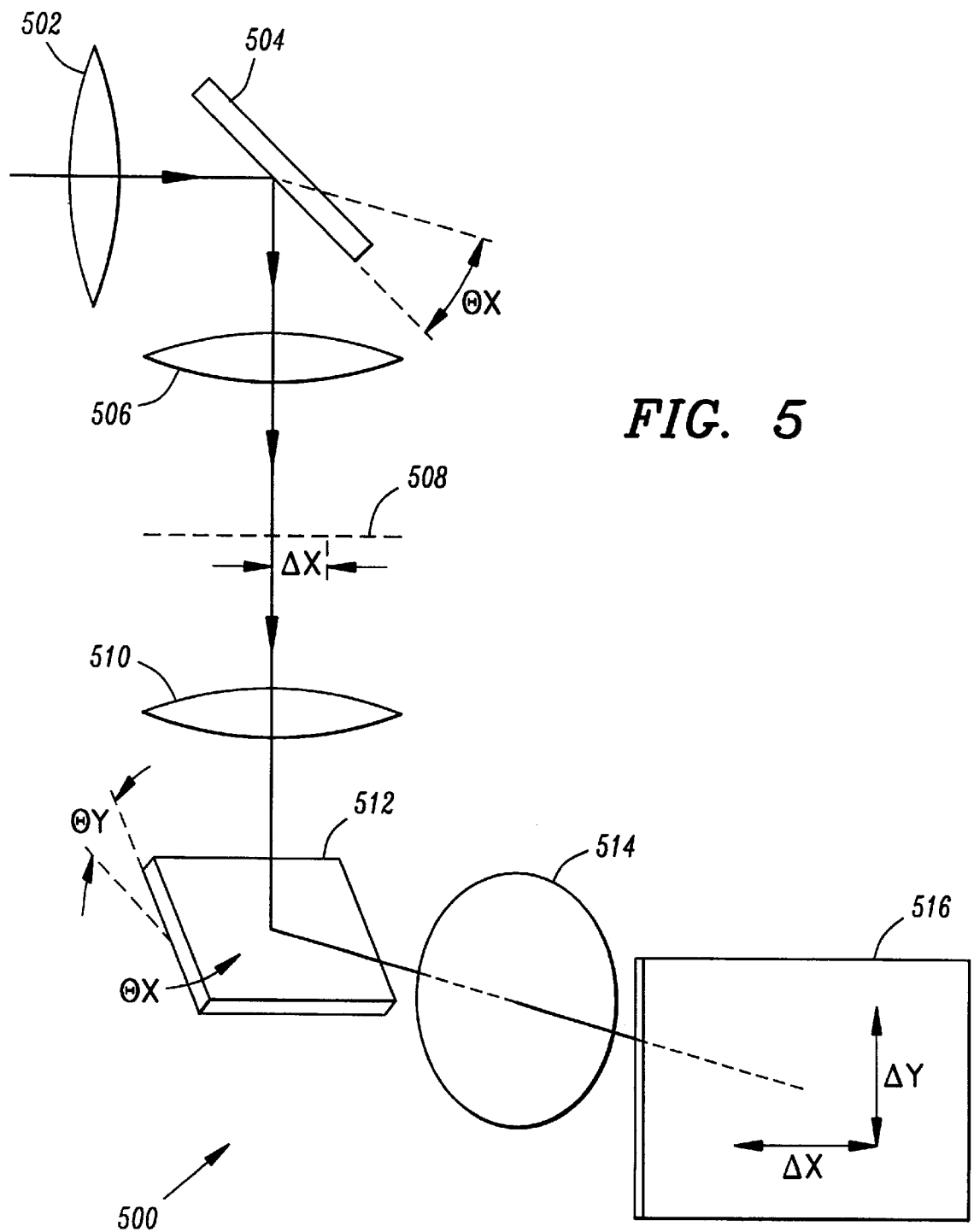
FIG. 5 illustrates a two dimensional steering system according to a third embodiment of the present invention.
Figure 6:
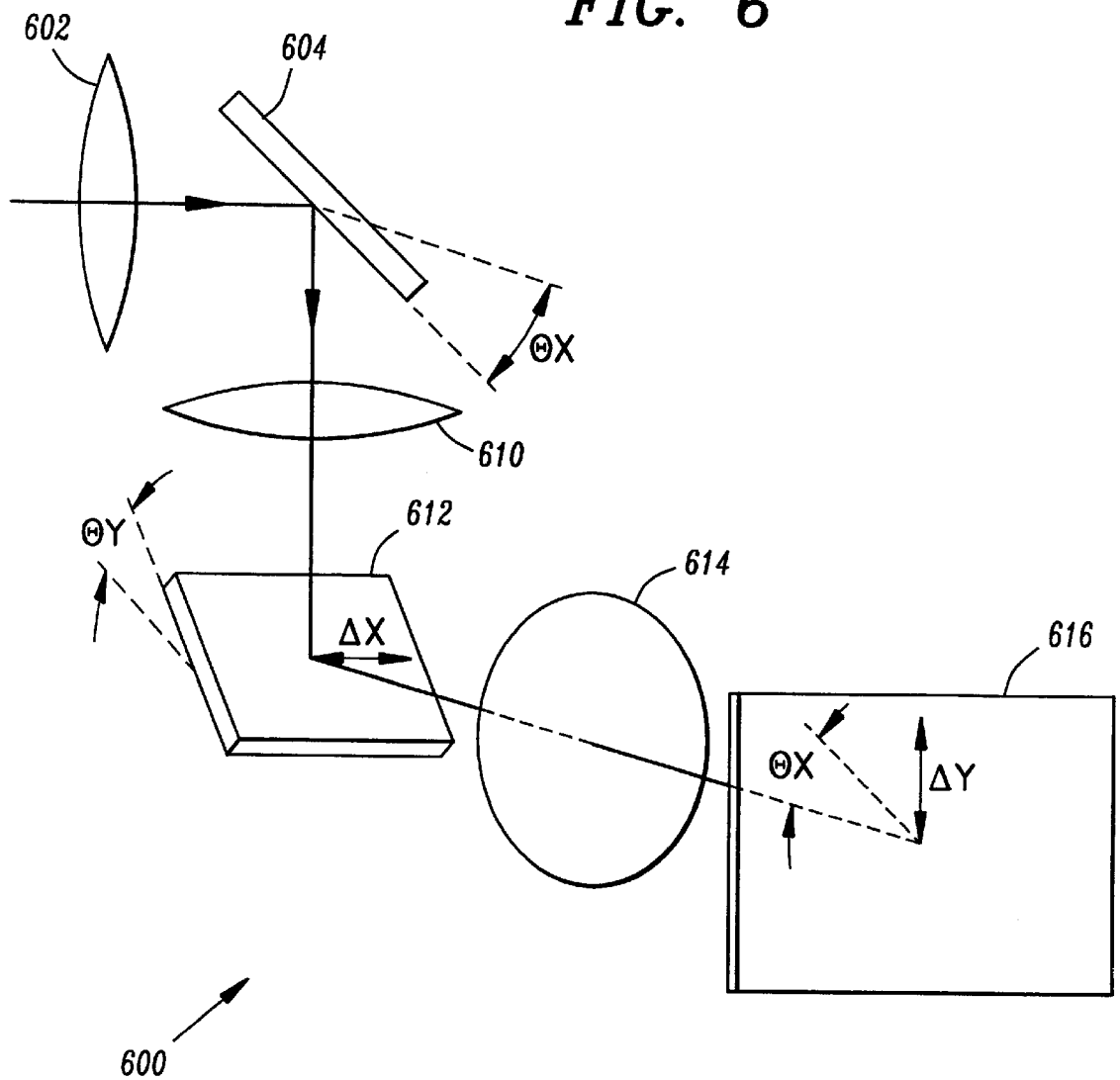
FIG. 6 illustrates a two dimensional steering system according to a third embodiment of the present invention.

The focal plane steering systems illustrated in FIGS. 3 and 4 are suitable for steering high SBP images greater than 100 in one dimension only. FIGS. 5 and 6 which follow present alternate embodiments of the present invention that are suitable for steering high SBP images in two, perhaps orthogonal (perpendicular) dimensions.

FIG. 5 illustrates two dimensional (2D) steering system 500 according to a third embodiment of the present invention. A plane wave object beam is projected through an SLM (such as the SLM 402 of FIG. 4) and the object beam eventually is projected through lens 502, which may be the equivalent of lens 304 in FIG. 3 or the equivalent of lens 406 in FIG. 4. Therefore, mirror 504 may be positioned at either the Fourier focal plane or the output image focal plane of the original SLM image. In either case, rotatable mirror 504 rotates through an angle, θX, and reflects the Fourier or image focal plane image of the input object through lens 506. At Fourier plane 508, lens 506 produces a Fourier transform of the image reflected by mirror 504. Rotation of mirror 504 produces a displacement, ΔX, in the X-axis at Fourier plane 508, where ΔX=f(tan θX).

The displaced image at Fourier plane 508 forms the input object for lens 510. Rotatable mirror 512 is positioned at the Fourier focal plane of lens 510. It will be recalled that positional information at the input object plane becomes angular information at the Fourier transform plane and that angular information at the input object plane becomes positional information at the Fourier transform plane. Therefore, the positional displacement, ΔX, of the input object at Fourier plane 508 produces a corresponding angular displacement, θX, of the angle of incidence of the object beam on mirror 512 for any given rotation of mirror 512.

The image formed on mirror 512 is the input object to lens 514, which produces its own Fourier transform at HMC 516. Again, it will be recalled that positional information at the input object plane becomes angular information at the Fourier transform plane and that angular information at the input object plane becomes positional information at the Fourier transform plane. Therefore, the angular displacement, θX, of the image reflected by rotatable mirror 512 produces a corresponding positional displacement, ΔX, of the image reflected by mirror 512 at HMC 516. The Fourier transform formed by lens 514 on HMC 516 transforms the angular displacement, θX, back into a positional displacement ΔX. Thus, rotation of mirror 504 produces a displacement, at Fourier plane 508 as well as at HMC 516.

However, rotatable mirror 512 also produces a displacement, ΔY, in the orthogonal Y-axis. As noted, the image at plane 508, which is displaced by ΔX in the X-axis, forms the input object for lens 510. Rotatable mirror 512 rotates through an angle, θY, and reflects the Fourier transform formed by lens 510 through lens 514. The angular rotation, θY, produces the positional displacement, ΔY, at HMC 516, where ΔY=f(tan θY). Lens 510, mirror 512 and lens 514 similarly form a 4-f imaging system for the ΔX-displaced input object formed at Fourier focal plane 508, wherein mirror 512 produces a second displacement in the Y-axis. Thus, the combination of mirrors 504 and 512 provides independent steering in two orthogonal axes, as indicated on HMC 516.

FIG. 6 illustrates two-dimensional (2D) steering system 600 according to a fourth embodiment of the present invention. 2D steering system 600 has many similarities to 2D steering system 500. Unlike 2D steering system 500, however, 2D steering system 600 produces a positional displacement of the input plane in one axis and produces an angular displacement of the input plane in the orthogonal axis.

A plane wave object beam is projected through an SLM (such as the SLM 402 of FIG. 4) and the object beam eventually is projected through lens 602, which may be the equivalent of lens 304 in FIG. 3 or the equivalent of lens 406 in FIG. 4. Therefore, mirror 604 may be positioned at either the Fourier focal plane or the output image focal plane of the original SLM object. In either case, rotatable mirror 604 rotates through an angle, θX, and reflects the Fourier or image focal plane of the input object through lens 610. Rotatable mirror 612 is positioned at the Fourier focal plane of lens 610, so that lens 610 produces on mirror 612 a Fourier transform of the output reflected by mirror 604. Rotation of mirror 604 produces a displacement, ΔX, on mirror 612, of the input image, where ΔX=f(tan θX).

The ΔX-displaced image on mirror 612 forms the input object for lens 614. Lens 614 forms the Fourier transforms of the ΔX-displaced image reflected by mirror 612 at HMC 616. The positional displacement, ΔX, of the beam at mirror 612 produces a corresponding angular displacement, θX, for that beam at HMC 616 for any given rotation of mirror 612. In sum, the rotation, θX, of mirror 604 produces an angular displacement, θX, of the angle of incidence of the output beam at HMC 616.

Rotatable mirror 612 then produces a displacement, ΔY, in the orthogonal Y-axis. The input beam reflected by rotatable mirror 604 forms the input object for lens 610. Lens 610, mirror 612 and lens 614 similarly form a 4-f imaging system for the input object reflected by mirror 604, wherein mirror 612 produces a second displacement in the Y-axis. Rotatable mirror 612 rotates through an angle, θY, and reflects the Fourier transform formed by lens 610 through lens 614. The angular rotation, θY, produces the positional displacement, ΔY, at HMC 616, where ΔY=f(tan θY).

Thus, the combination of mirrors 604 and 612 provides independent steering in two orthogonal axes, as indicated on HMC 616. Furthermore, the input beam is angularly displaced in the θX-axis by mirror 604 and positionally displaced in the orthogonal Y-axis by mirror 612.

In alternate embodiments of the present invention, angle and position displacements at HMC 616 can also be in the same axis (e.g., displacements may be θX and ΔX). This type of arrangement would be particularly useful in multilayer angle-multiplexed holographic memory systems, wherein many memory cells are stacked atop one another.

In alternate embodiments of the present invention, the steering systems described above may be used for coarse control steering of the object beam across the HMC, while fine control scanning may be achieved by other means, such as those described in United States Patent Application Serial No. (Attorney Docket No. CAMPBELL 6-14-3), entitled "System and Method Using Linear Translation to Access Data Locations in a Holographic Memory" and filed concurrently herewith.

The one-dimensional (1D) and two-dimensional (2D) beam steering systems may be further improved by utilizing a "mirror image" setup of mirrors and lenses on the opposing side of the HMC. In this way, data may be steered onto two sides of the HMC simultaneously. As will be explained below in connection with FIG. 7, a "mirror image" optical setup on the opposing side of the HMC may also be used to retrieve data from the HMC, if the spatial light modulator is replaced with a two-dimensional array of light sensitive detectors.

Figure 7:
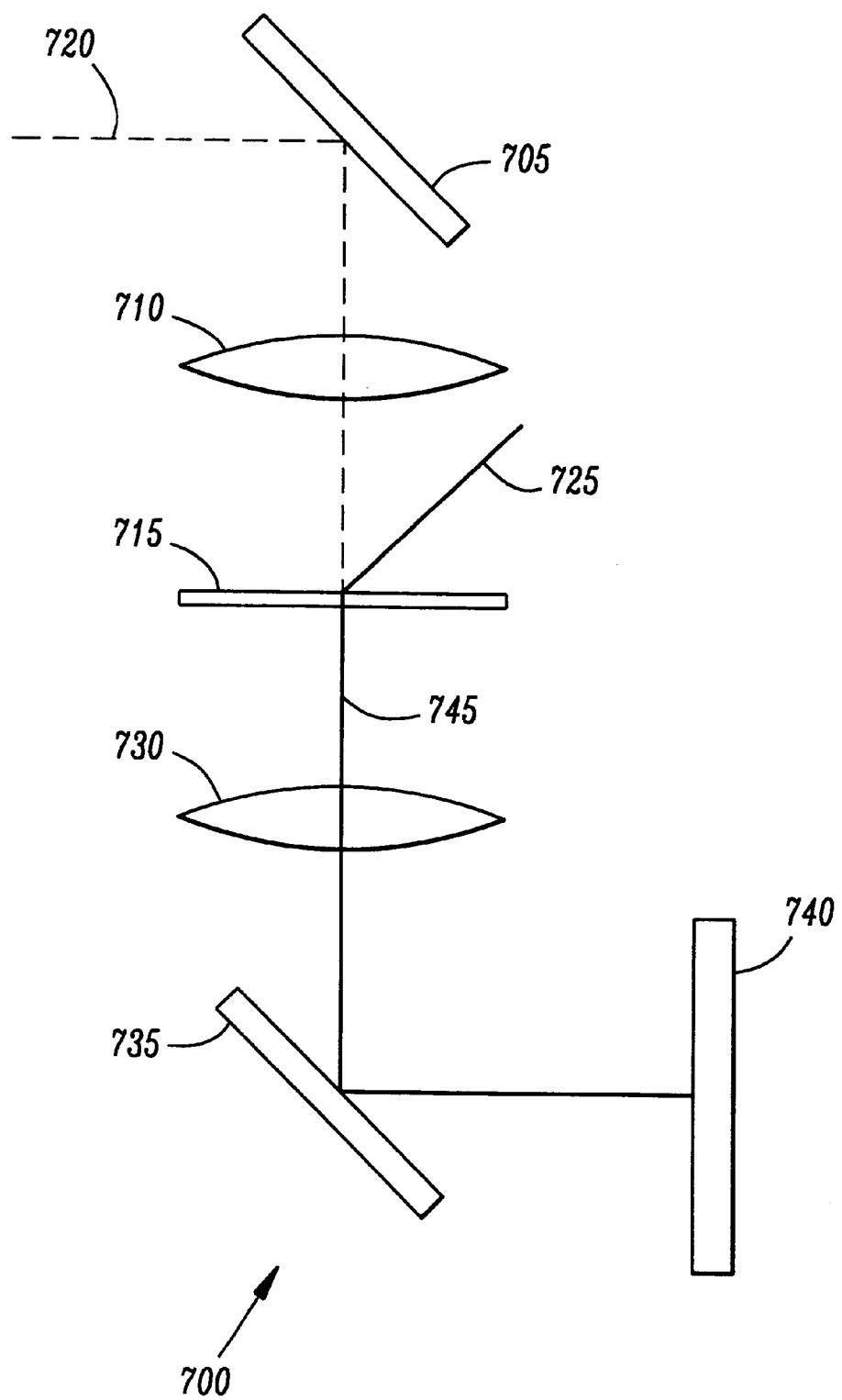
FIG. 7 illustrates a holographic memory system according to a fourth embodiment of the present invention.

FIG. 7 illustrates holographic memory system 700 according to a fourth embodiment of the present invention. Mirror 705 and lens 710 comprise a beam steering system for steering object beam 720 (shown as a dotted line) onto HMC (HMC) 715. Object beam 720 may be received from either a 4-f imaging system or a single lens imaging system, such as the systems illustrated in FIGS. 3 and 4.

As previously described, reference beam 725 (shown as a solid line) and object beam 720 interact to produce a holographic image at a selected position. The position is determined by the angle, $θ_k$, of mirror 705. The hologram is a function of the relative amplitudes and polarization states of, and the phase differences between, object beam 720 and reference beam 725, and the angles at which object beam 720 and reference beam 725 are projected onto HMC 715.

Data is retrieved using lens 730 and mirror 735, which comprise a "mirror image" of lens 710 and mirror 705. Object beam 720 may be reconstructed by projecting reference beam 725 into HMC 715 at the same angle and position used to produce the hologram. The hologram and reference beam 725 interact to reproduce the reconstructed object beam 745 (shown as a solid line). The desired data page may be selected by rotating mirror 735 to the same angle, $θ_k$, to which mirror 705 was rotated when the hologram was formed. Reconstructed object beam 745 is then projected onto light sensitive photodetector array 740, which reads back the data by sensing the pattern of light and dark pixels. Advantageously, lens 730 and mirror 735 not only "desteer" reconstructed object beam 745 onto photodetector array 740, but they also correct for off-axis distortion effects that may be caused by mirror 705 and lens 710.

Although the above-described beam steering systems are utilized to steer an object beam to selected positions on an HMC, this is by way of illustration only and should not be construed to limit the scope of the present invention in any way. Those skilled in the art will appreciate that the beam steering systems disclosed herein may be readily adapted to steer a reference beam instead.

Although the present invention has been described in detail, those skilled in the art should understand that they can make various changes, substitutions and alterations herein without departing from the spirit and scope of the invention in its broadest form.

What is claimed is:

1. A system for steering a complex, spatially-modulated incident beam of coherent light having a space-bandwidth product greater than 100 to gain access to data locations in a holographic memory cell (HMC), comprising:

a reflective element, locatable proximate a first focal plane of said incident beam;

a rotational steering mechanism, coupled to said reflective element, that orients said reflective element according to a desired rotational angle to steer said incident beam in a desired direction; and a refractive element that refracts said beam reflected from said reflective element to create a second focal plane for said beam, said HMC locatable proximate said second focal plane to receive said beam at a location thereon that is a function of said desired direction.

2. The system as recited in claim 1 wherein said first focal plane is a Fourier transform plane.

3. The system as recited in claim 1 wherein said first focal plane is an image plane.

4. The system as recited in claim 1 wherein said reflective element is a mirror.

5. The system as recited in claim 1 wherein said refractive element is a convex lens.

6. The system as recited in claim 1 further comprising a spatial light modulator for receiving coherent light from a light source and emitting a coherent data-encoded light beam therefrom.

7. The system as recited in claim 6 wherein said incident beam of light is derived from said data-encoded light beam.

8. The system as recited in claim 1 further comprising:

a second reflective element, locatable proximate said second focal plane;

a second rotational steering mechanism, coupled to said second reflective element, that orients said second reflective element according to a second desired rotational angle to steer said incident beam in a second desired direction; and a second refractive element that refracts said beam reflected from said second reflective element to create a third focal plane for said beam, said HMC locatable proximate said third focal plane to receive said beam at a planar location thereon that is further a function of said second desired direction.

9. A method of steering a complex, spatially-modulated incident beam of coherent light to gain access to data locations in a holographic memory cell (HMC), comprising the steps of:

deriving said incident beam from a data-encoded light beam having a space-bandwidth product greater than 100;

orienting a reflective element, locatable proximate a first focal plane of said incident beam, according to a desired rotational angle to steer said incident beam in a desired direction; and refracting said beam reflected from said reflective element to create a second focal plane for said incident beam, said HMC locatable proximate said second focal plane to receive said beam at a location thereon that is a function of said desired direction.

10. The method as recited in claim 9 wherein said first focal plane is a Fourier transform plane.

11. The method as recited in claim 9 wherein said first focal plane is an image plane.

12. The method as recited in claim 9 wherein said reflective element is a mirror.

13. The method as recited in claim 9 wherein said refractive element is a convex lens.

14. The method as recited in claim 9 further comprising the steps of:

orienting a second reflective element, locatable proximate said second focal plane, according to a second desired rotational angle to steer said beam in a second desired direction; and refracting said beam reflected from said second reflective element to create a third focal plane for said beam, said HMC locatable proximate said third focal plane to receive said beam at a planar location thereon that is further a function of said second desired direction.

15. A system for storing data, comprising:

a coherent light source;

a spatial light modulator located to modulate a complex, spatially-modulated beam of coherent light having a space-bandwidth product greater than 100 received from said coherent light source;

a reflective element, located proximate a first focal plane of said modulated beam;

a rotational steering mechanism, coupled to said reflective element, that orients said reflective element according to a desired rotational angle to steer said modulated beam in a desired direction;

a refractive element that refracts said modulated beam reflected from said reflective element to create a second focal plane for said beam; and a substantially planar holographic memory cell (HMC), located proximate said second focal plane, that receives said refracted beam at a location thereon that is a function of said desired direction.

16. The system as recited in claim 15 wherein said first focal plane is a Fourier plane.

17. The system as recited in claim 15 wherein said first focal plane is an image plane.

18. The system as recited in claim 15 wherein said reflective element is a mirror.

* * * * *